(12) United States Patent
Huang et al.

(10) Patent No.: US 6,561,819 B1
(45) Date of Patent: May 13, 2003

(54) TERMINALS OF SOCKET CONNECTOR

(75) Inventors: Chieh-Jung Huang, Tu-Chen (TW); Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/253,953

(22) Filed: Sep. 23, 2002

(30) Foreign Application Priority Data

Dec. 26, 2001 (TW) ...................................... 90223012 U (51) Int. Cl.[7] .............................................. H01R 12/00
(52) U.S. Cl. ...................................................... 439/66
(58) Field of Search ............................ 439/66, 591, 71, 439/83, 74, 91, 862

(56) References Cited

U.S. PATENT DOCUMENTS 5,324,205 A * 6/1994 Ahmad et al. ................ 439/66
6,447,304 B1 * 9/2002 Korsunsky et al. ........... 439/66

* cited by examiner

Primary Examiner—Tho D. TA
(74) Attorney, Agent, or Firm—Wei Te Chung (57) ABSTRACT

A socket connector (1) for electrically connecting a CPU (2) to a PCB (3) includes an insulative housing (10) and a number of terminals (11) obliquely received in the insulative housing. The insulative housing defines a number of slant terminal slot (104) for receiving corresponding terminals and a number of slant position slots (105) communicating with the respective terminal slots. Each of the terminals includes a retention portion (111) received in a corresponding position slot, a mating portion (113) extending from a top end of the retention portion and a soldering portion (112) extending from a bottom end of the retention portion.

3 Claims, 8 Drawing Sheets

TERMINALS OF SOCKET CONNECTOR

BACKGROUND OF THE INVENTION

1. Field of the Invention

The present invention relates to a socket connector, and particularly to a socket connector for electrically connecting a central process unit (CPU) to a printed circuit board (PCB).

2. Description of Related Art

Figure 6:
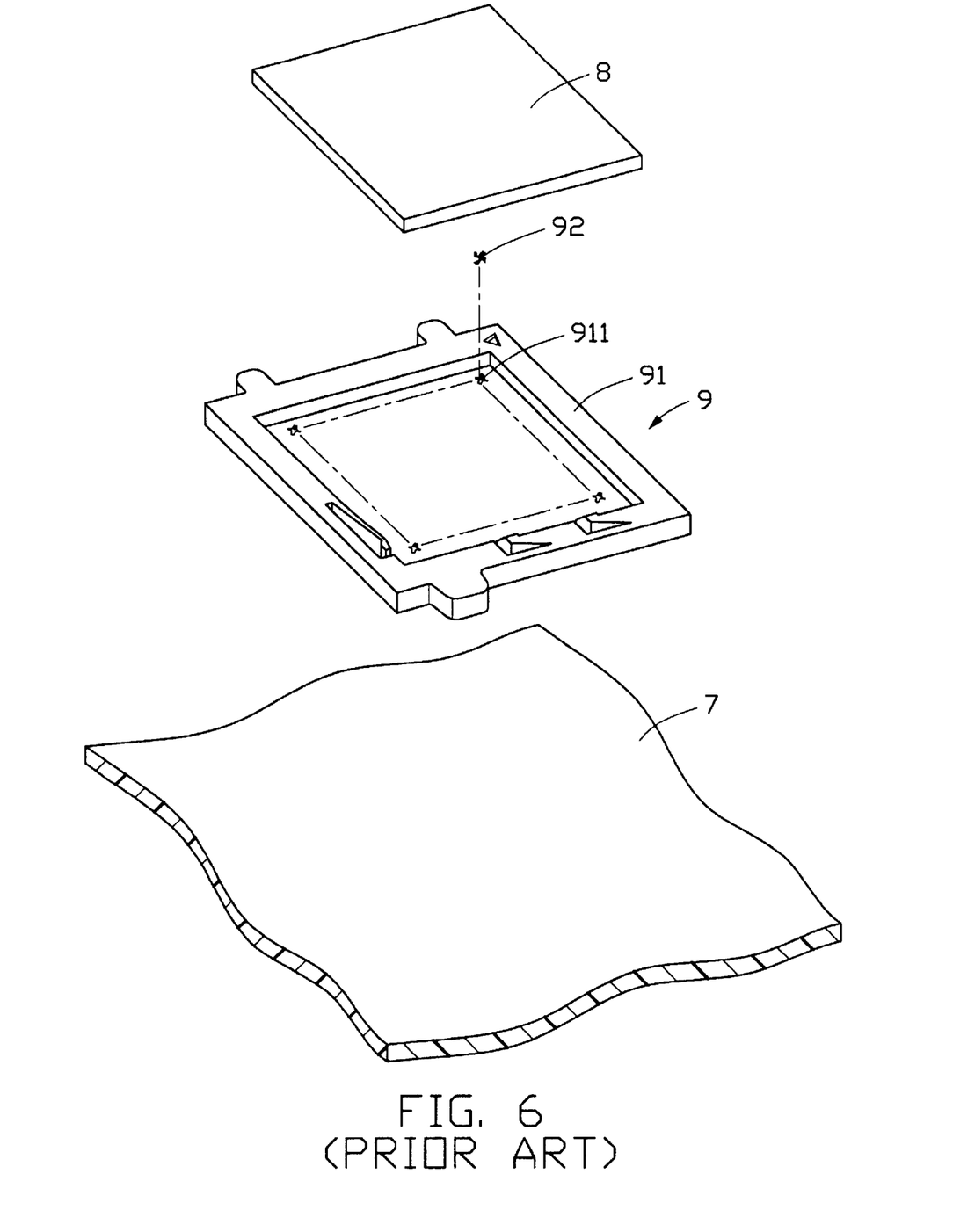
FIG. 6 is a perspective view of a conventional socket connector and a PCB and a CPU.
Figure 7:
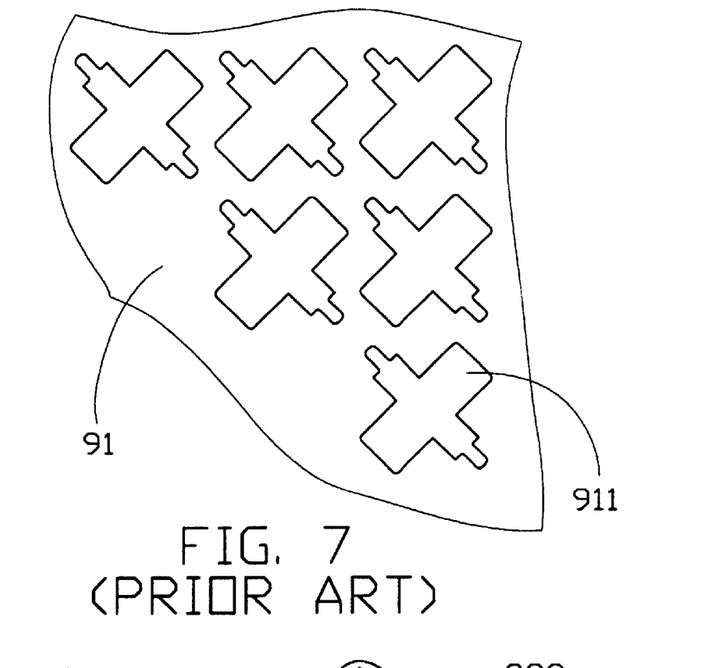
FIG. 7 an enlarged top view of terminal slots of the socket connector of FIG. 6.
Figure 8:
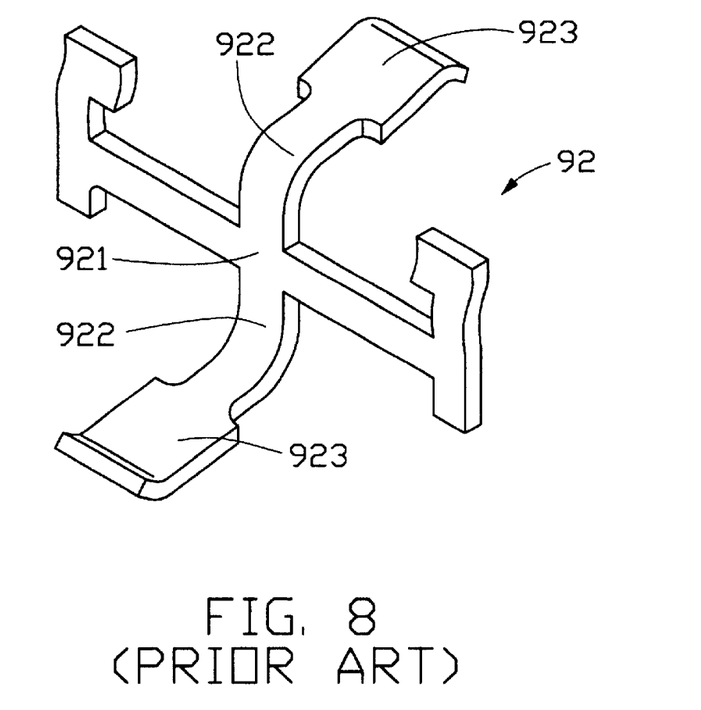
FIG. 8 an enlarged view of a terminal in FIG. 6.

Referring to FIGS. 6–8, U.S. Pat. No. 6,186,797 discloses a socket connector 9 for electrically connecting a land grid array (LGA) CPU 8 to a PCB 7. The socket connector 9 includes an insulative housing 91 and a plurality of terminals 92. The insulative housing 91 defines a plurality of terminal slots 911 for receiving the respective terminals 92. Each of the terminals 92 includes a retention portion 921, a pair of spring arms 922 extending from opposite ends of the retention portion 921 and a pair of mating portions 923 located at free ends of the spring arms 922.

Figure 9:
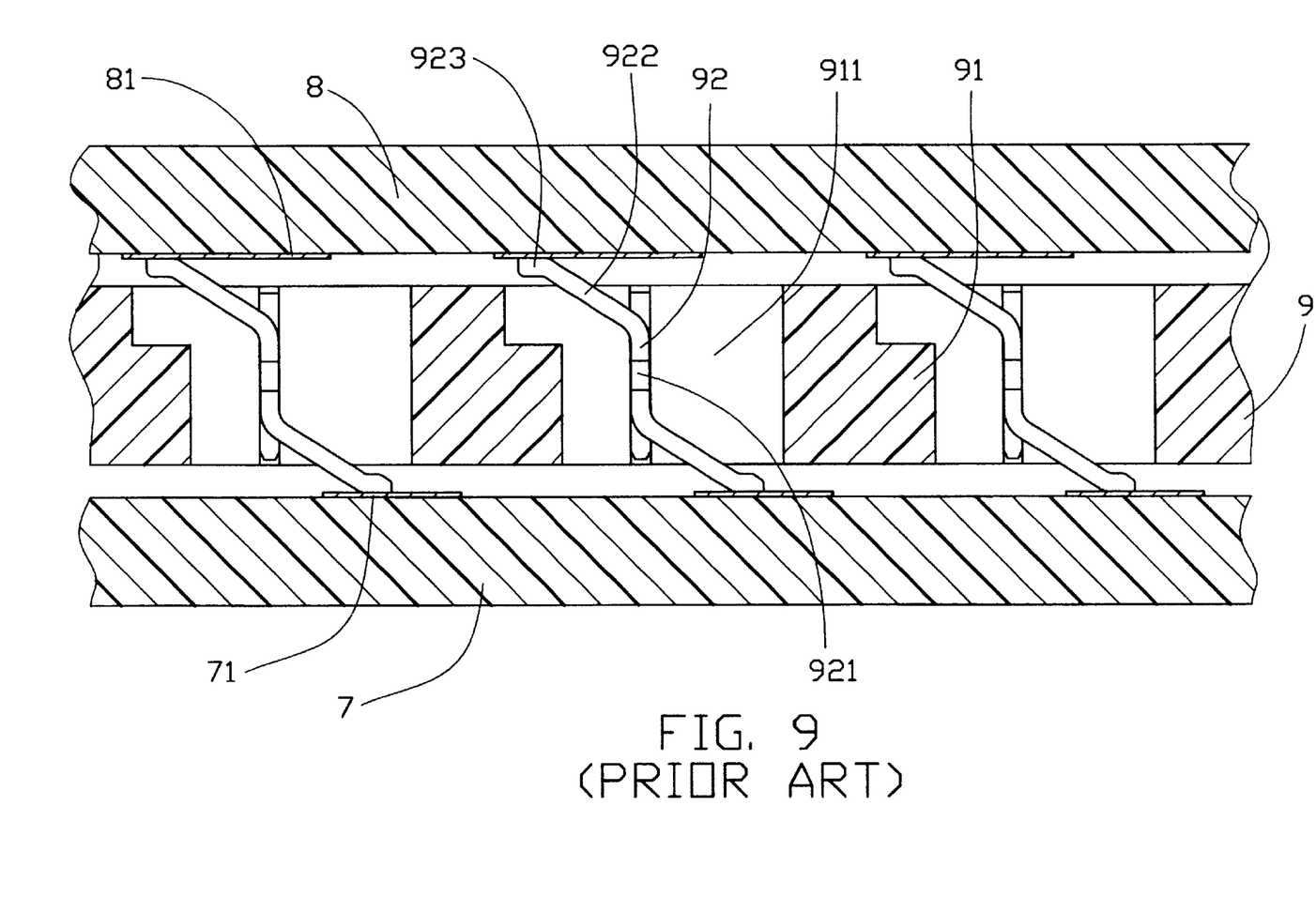
FIG. 9 is a cross-sectional view of the conventional socket connector, the PCB and the CPU, wherein the terminals are not compressed by the PCB and the CPU.
Figure 10:
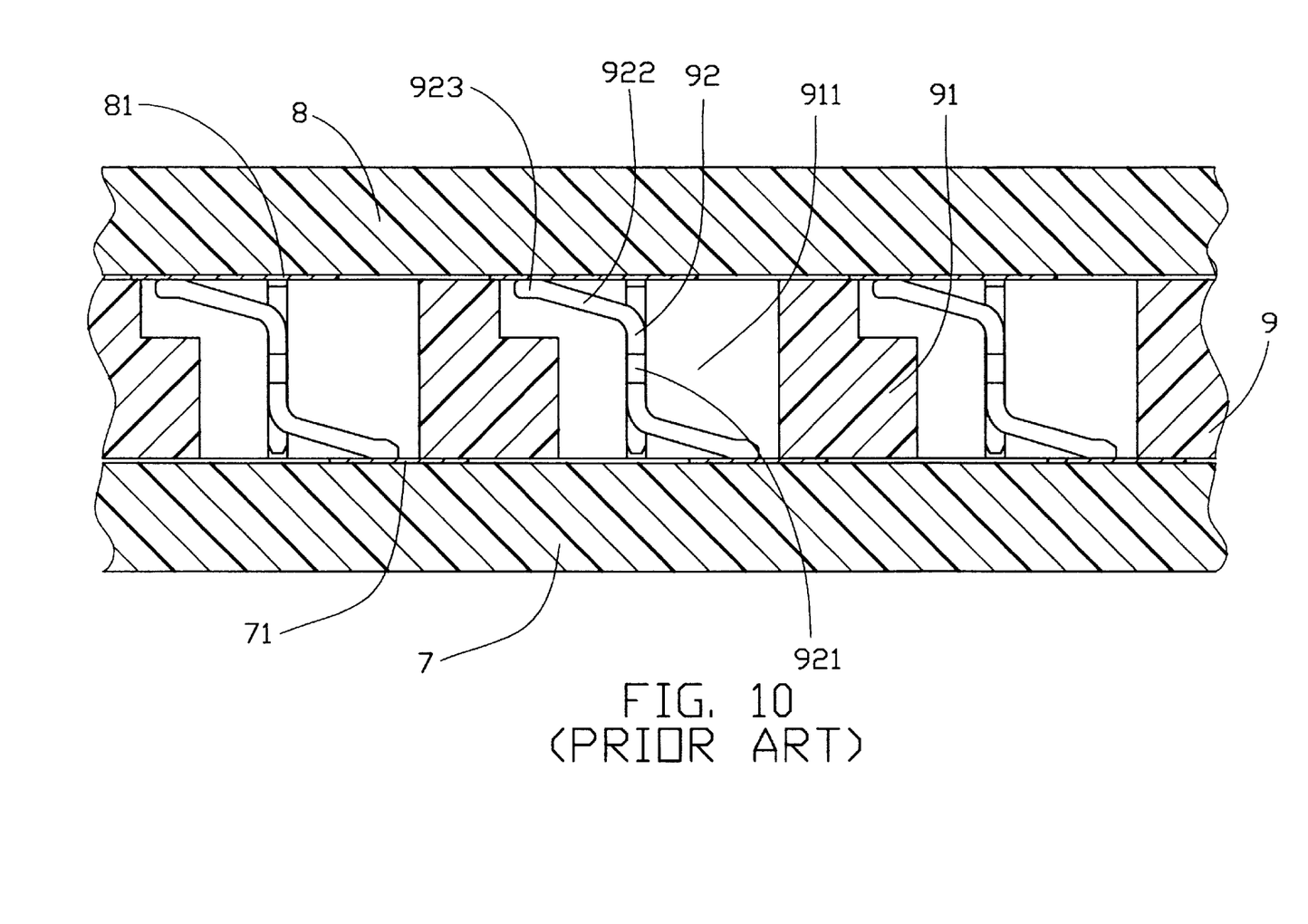
FIG. 10 is a view similar to FIG. 9 except that the terminals are compressed by the PCB and the CPU.

Referring to FIG. 9, the LGA CPU 8 and the PCB 7 are arranged at two opposite sides of the socket connector 9 and the spring arms 922 of the terminals 92 are in a free state. Referring to FIG. 10, as the LGA CPU 8 and the PCB 7 move closer toward the socket connector 9, the mating portions 923 of the terminals 92 contact with corresponding first contacting pads 81 of the LGA CPU 8 and corresponding second pads 71 of the PCB 7. The spring arms 922 deflect resiliently in the terminal slots 911. The mating portions 923 press against corresponding pads 81 (71) due to the resilient force of the spring arms 922 thereby establishing an electrical connection between the LGA CPU 8 and the PCB 7. However, because the spring arms 922 extend from two opposite sides of the retention portion 921, the effective length of an individual spring arm 922 is limited as to be unable to provide sufficient resiliency when mating.

Hence, an improved socket connector is required to overcome the disadvantage of the conventional socket connector. U.S. Pat. No. 6,447,304 having the same assignee with the invention, discloses some approach.

SUMMARY OF THE INVENTION

Accordingly, an object of the present invention is to provide a socket connector having terminals with good resiliency.

In order to achieve the object set forth, a socket connector for electrically connecting with a CPU and a PCB includes an insulative housing and a plurality of terminals slantly received in the insulative housing. The insulative housing defines a plurality of slant terminal slots and a plurality of slant position slots communicating with corresponding terminal slots. Each terminal includes a retention portion received in a corresponding position slot, a mating portion extending from a top end of the retention portion and a soldering portion extending from a bottom end of the retention portion for contacting with a corresponding contacting pad of the PCB. The mating portion includes a spring arm and a contacting portion at a top end of the spring arm for contacting with a corresponding soldering pad of the CPU. The contacting portion is much farther from the retention portion than the soldering portion is. Therefore, the length of spring arm is relatively long so that the resiliency of the spring arm is improved.

Other objects, advantages and novel features of the invention will become more apparent from the following detailed description of the preferred embodiment when taken in conjunction with the accompanying drawings.

DETAILED DESCRIPTION OF THE INVENTION

Reference will now be made to the drawing figures to describe the present invention in detail.

Figure 1:
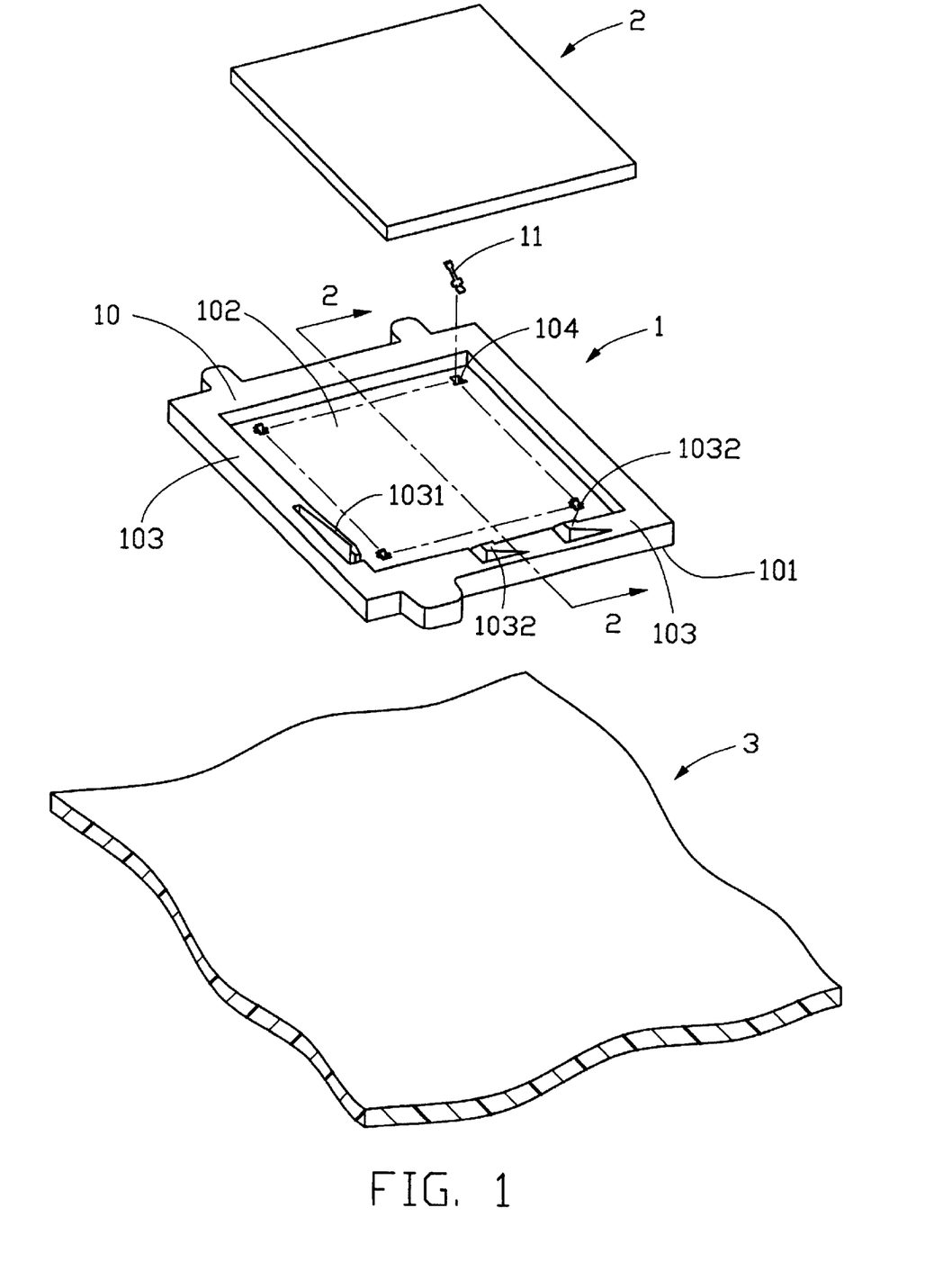
FIG. 1 is a perspective view of a socket connector of the present invention and a PCB and a CPU.
Figure 2:
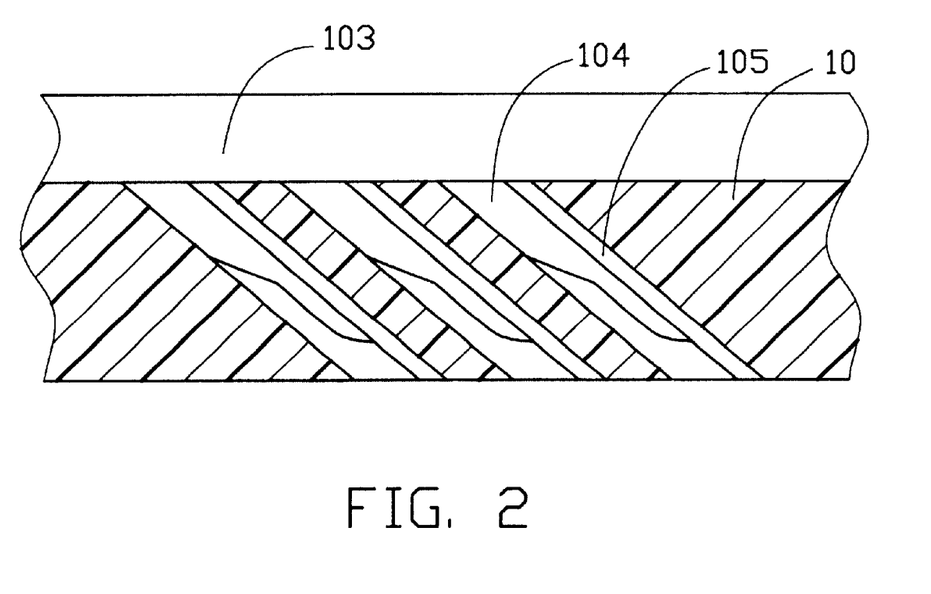
FIG. 2 is a partially cross-sectional view of the socket connector taken along line 2—2 of FIG. 1 wherein terminals are removed.

Referring to FIGS. 1 and 2, a socket connector 1 of the present invention is used for electrically connecting a CPU 2 to a PCB 3. The socket connector 1 includes an insulative housing 10 and a plurality of terminals 11 received in the insulative housing 10. The insulative housing 10 has a mounting surface 101 close to the PCB 3 and an opposite mating surface 102 close to the CPU 2. The insulative housing 10 has two pairs of opposite outer flanges 103 around the mating surface 102, and a first and a second resilient contact arms 1031, 1032 at two adjacent ones of the outer flanges 103 for positioning the CPU 2. A plurality of terminal slots 104 are angularly defined between the mating surface 102 and the mounting surface 101 for receiving the respective terminals 11. In addition, the insulative housing 10 defines a plurality of slant position slots 105 communicating with the respective terminal slots 104 for retaining the terminals 11 at true position.

Figure 3:
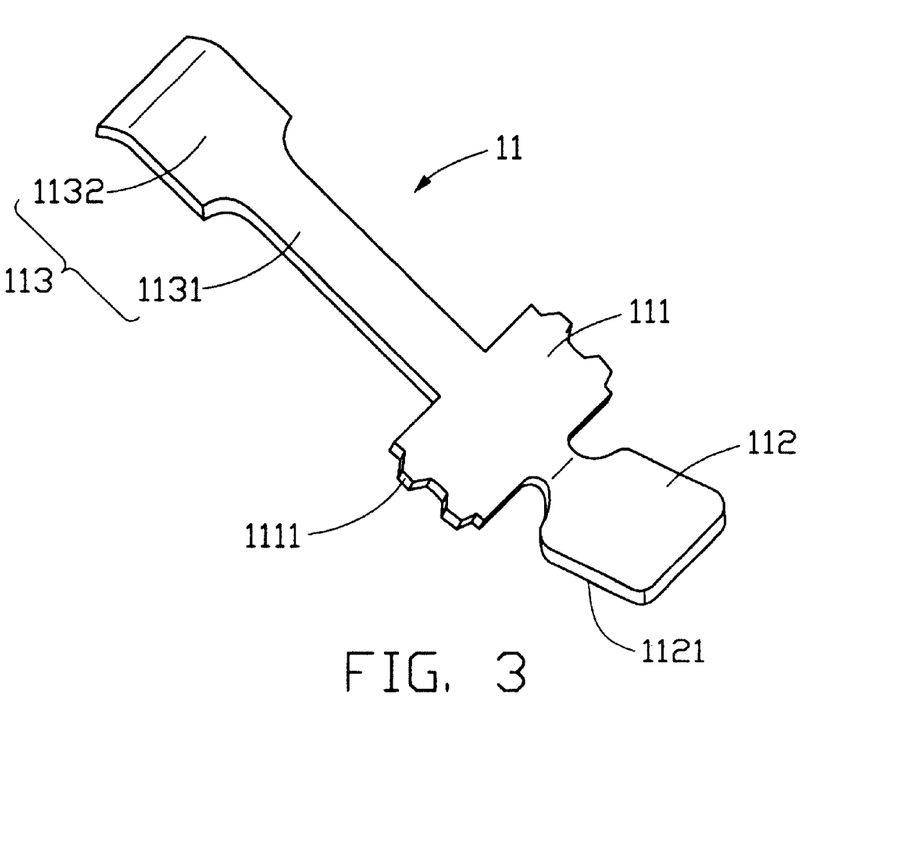
FIG. 3 is an enlarged perspective view of a terminal in FIG. 1.

Referring to FIG. 3, each of the terminals 11 includes a retention portion 111, and a substantially horizontal soldering portion 112 extending from a bottom end of the retention portion 111 and a mating portion 113 extending from a top end of the retention portion 111. The retention portion 111 forms a plurality of barbs 1111 at two lateral sides thereof. The mating portion 113 is received in a corresponding one of the terminal slots 104 and includes a spring arm 1131 and a contacting portion 1132 at a free end of the spring arm 1131. It is clearly shown in FIG. 3 that the contacting portion 1132 is much farther from the retention portion 111 than the soldering portion 112 is so that the spring arm 1131 is relatively long, therefore, the spring arm 1131 is much flexible.

Figure 4:
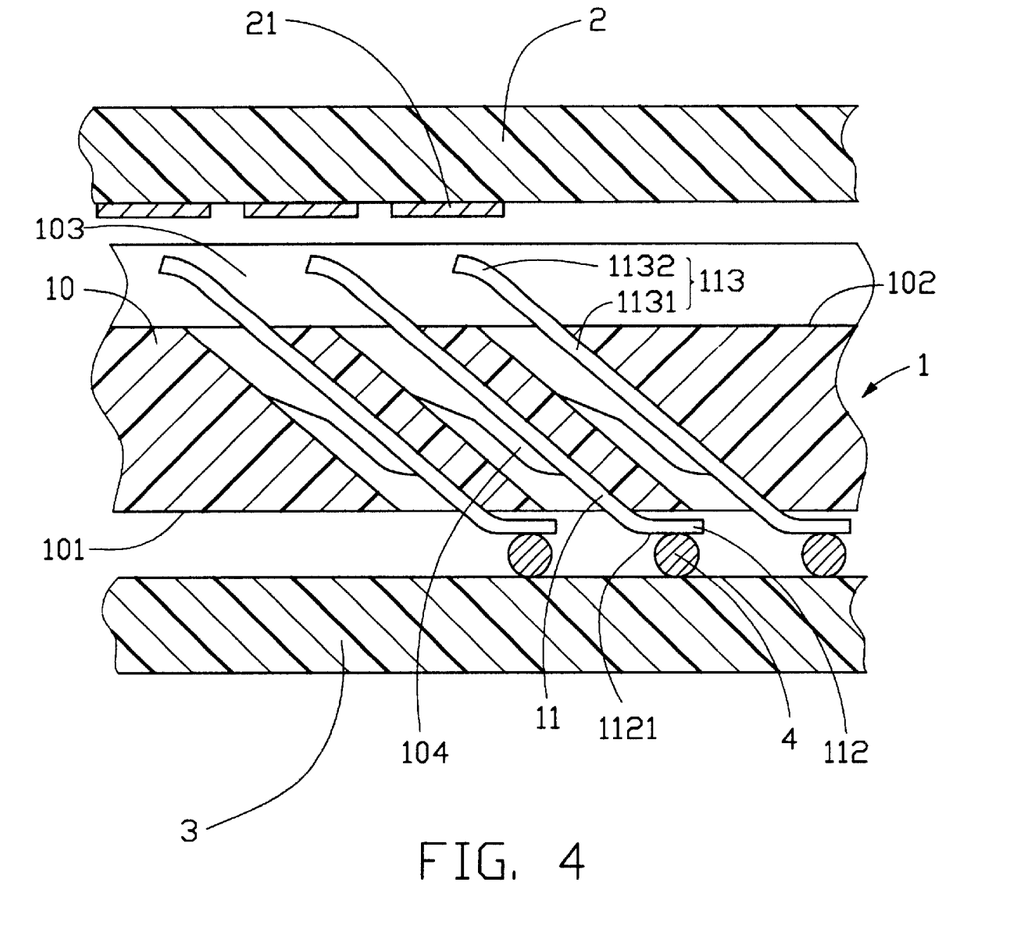
FIG. 4 is a cross-sectional view of the socket connector, the PCB and the CPU disengaged from each other.

Further, referring to FIG. 4, the CPU 2 and the PCB 3 are located at two opposite sides of the socket connector 1, respectively. The retention portion 111 is received in the position slot 105 with the barbs 1111 engaging with the insulative housing 10 to securely retain the terminal 11 in the insulative housing 10. The soldering portion 112 of the terminal 11 extends beyond the mounting surface 101 and is soldered to the PCB 3 by a solder ball 4 attached to a bottom surface 1121 of the soldering portion 112. The contacting portion 1132 extends beyond the mating surface 102 of the insulative housing 10 for mating with a corresponding contacting pad 21 of the CPU 2. It is clearly shown in FIG. 5 that the terminals 11 are obliquely received in the respective terminal slots 104 such that the contacting portion 1132 offsets a predetermined distance from the soldering portion 112.

Figure 5:
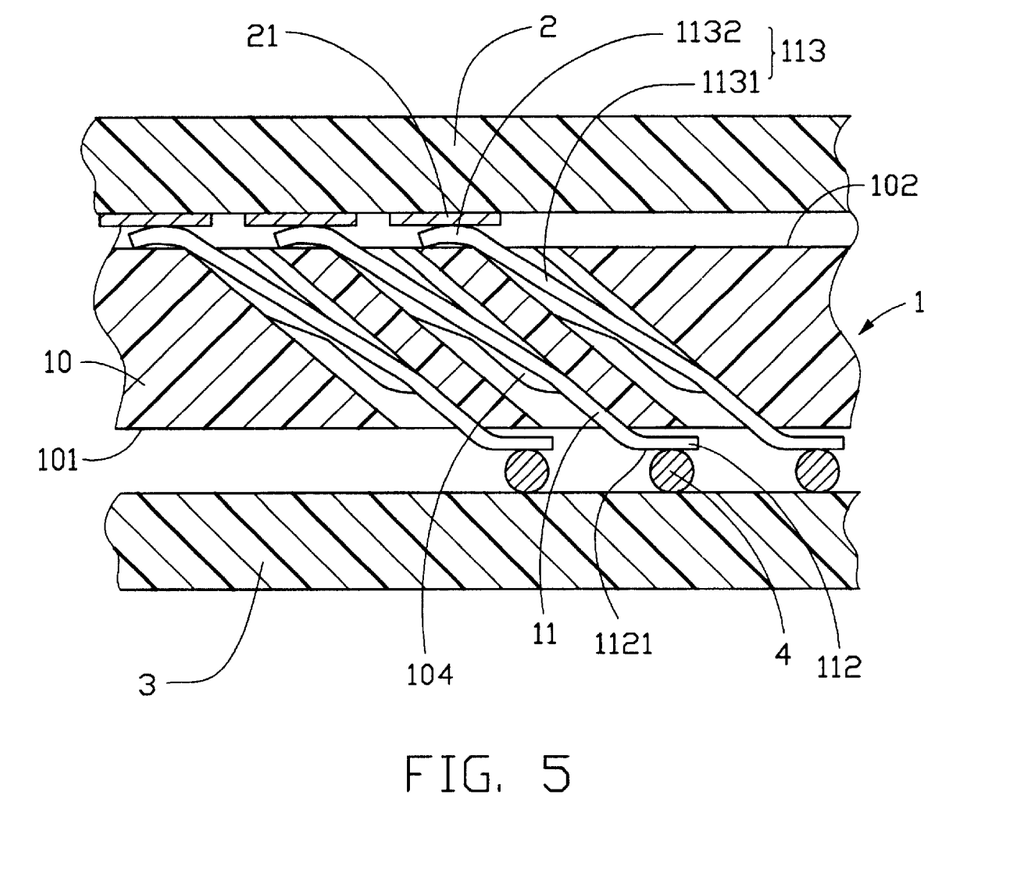
FIG. 5 is a fully assembled view of FIG. 4.

Referring to FIG. 5, as the CPU 2 is pressed downwardly, the spring arm 1131 of the terminal 11 deforms resiliently for an external force exerted by the CPU 2. The contacting portion 1132 of the terminal 11 securely presses against a corresponding contacting pad 21 of the CPU 2 due to the restoring resilient force of the spring arm 1131. Therefore, an electrical connection is established between the CPU 2 and the PCB 3. Meanwhile, the contacting portion 1132 of the terminal 11 is exposed out of the terminal slot 104 and abuts against the mating surface 102 of the insulative housing 10.

In the present invention, because the terminals 11 are obliquely received in the slant terminal slots 104 of the insulative housing 10, the terminal 11 may be longer than the conventional terminal. In addition, as the mounting section 111 is arranged close to the mating portion 112, the spring arm 1131 is longer than the conventional terminal 4. Therefore, resiliency of the terminal 11 is improved.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket connector for electrically connecting a CPU to a PCB, comprising:

an insulative housing defining a plurality of slant terminal slots;

a plurality of terminals obliquely received in corresponding slant terminal slots, each terminal including a retention portion, a mating portion extending from a top end of the retention portion and a soldering portion extending from a bottom end of the retention portion, the mating portion including a spring arm and a contacting portion at a top end of the mating portion for contacting with the CPU, the soldering portion being solderable to the PCB; wherein the contacting portion is further from the retention portion than the soldering portion from the retention portion;

wherein the retention portion forms a plurality of barbs at two opposite lateral sides thereof for engaging with the insulative housing and securely retaining the terminal in a corresponding slant terminal slot;

wherein the insulative housing defines a plurality of position slots communicating with corresponding slant terminal slots for receiving corresponding retention Portions of the terminals;

wherein both said soldering portion and said contacting portion are laterally offset from the direction of the corresponding slanted terminals slot.

2. A socket connector comprising:

an insulative housing defining opposite top and bottom surfaces with a plurality of slanted terminals slots extending therebetween; and a plurality of oblique terminals received in the corresponding slots, respectively, each of said terminals including a retention portion with a solder portion extending downward and a mating portion extending upwardly therefrom;

the solder portion extending beyond the bottom surface and further extending in a horizontal direction parallel to said bottom surface for permanently securing to a printed circuit board, and the mating portion extending above the top surface with at a distal end thereof a contacting portion adapted to be laterally and downwardly deflected toward the top surface by an attachable electronic component; wherein when assembled, at least one of said solder portion or said deflectable contacting portion is not located in a position along a direction of the corresponding slanted terminal slot but laterally offset to confront the bottom or top surface of the housing in a vertical direction;

wherein both said solder portion and said deflectable contacting portion are laterally offset from the direction of the corresponding slanted terminals slot;

wherein the contacting portion is further from the retention portion than the solder portion from the retention portion.

3. A socket connector comprising:

an insulative housing defining opposite top and bottom surfaces thereof, a plurality of slanted terminal slots extending through said top and bottom surfaces;

a plurality of terminals compliantly received in the corresponding terminal slots, respectively, each of the terminals including:

a stationary slanted retention portion fixed in the corresponding terminal slot;

a stationary solder portion extending from a bottom portion of the retention portion in a horizontal direction parallel to the bottom surface; and a deflectable cantilever type mating portion extending from a top portion of the retention portion and laterally moveable in the corresponding terminal slot with thereof a contacting portion exposed outside of the top surface while adapted to be downwardly and laterally pressed toward the top surface by an attachable electronic component;

wherein the contacting portion is further from the stationary slanted retention portion than the stationary solder portion from the stationary slanted retention portion;

wherein both said solder portion and said contacting portion are laterally offset from the direction of the corresponding slanted terminals slot.

* * * * *